(12) United States Patent  
Na et al.

(10) Patent No.: US 8,512,530 B2  
(45) Date of Patent: *Aug. 20, 2013

(54) SPUTTERING APPARATUS

(75) Inventors: Heung-Yeol Na, Yongin (KR); Jong-Won Hong, Yongin (KR); Seok-Rak Chang, Yongin (KR); Ki-Yong Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 241 days.

This patent is subject to a terminal disclaimer.

(21) Appl. No.: 12/926,115

(22) Filed: Oct. 27, 2010

(65) Prior Publication Data

US 2011/0139612 A1    Jun. 16, 2011

(30) Foreign Application Priority Data

Dec. 11, 2009    (KR) .................. 10-2009-0123185

(51) Int. Cl.
*C23C 14/35*    (2006.01)

(52) U.S. Cl.
USPC ............ 204/298.29; 204/298.06; 204/298.19; 204/298.2; 204/298.11; 204/298.14; 204/298.15; 204/298.23

(58) Field of Classification Search
USPC ............... 204/298.06, 298.2, 298.19, 298.23, 204/298.29, 298.11, 298.15, 298.14
See application file for complete search history.

(56) References Cited

U.S. PATENT DOCUMENTS

| 5,292,419 A * | 3/1994 | Moses et al. ............. 204/298.28 |
| 6,296,747 B1 * | 10/2001 | Tanaka ...................... 204/298.07 |
| 2004/0089534 A1 * | 5/2004 | Takahashi ................ 204/192.12 |
| 2004/0142230 A1 * | 7/2004 | Katori et al. .................... 429/42 |
| 2008/0296142 A1 * | 12/2008 | Le et al. ........................ 204/155 |

FOREIGN PATENT DOCUMENTS

| JP | 62-250173 A | 10/1987 |
| JP | 05-263228 | * 10/1993 |
| JP | 2000-119849 | * 4/2000 |
| JP | 2006-348322 A | 12/2006 |
| KR | 10 1999-0085014 A | 12/1999 |
| KR | 10-2002-0091949 A | 12/2002 |
| KR | 10-2007-0067139 A | 6/2007 |

* cited by examiner

*Primary Examiner* — Rodney McDonald
(74) *Attorney, Agent, or Firm* — Lee & Morse, P.C.

(57) ABSTRACT

A sputtering apparatus includes a process chamber having first and second regions, a metal target inside the process chamber, a target transfer unit inside the process chamber, the target transfer unit being configured to move the metal target between the first and second regions, a substrate holder in the second region of the process chamber, and a magnetic assembly in the first region of the process chamber, the magnetic assembly being interposed between the target transfer unit and a wall of the process chamber.

22 Claims, 1 Drawing Sheet

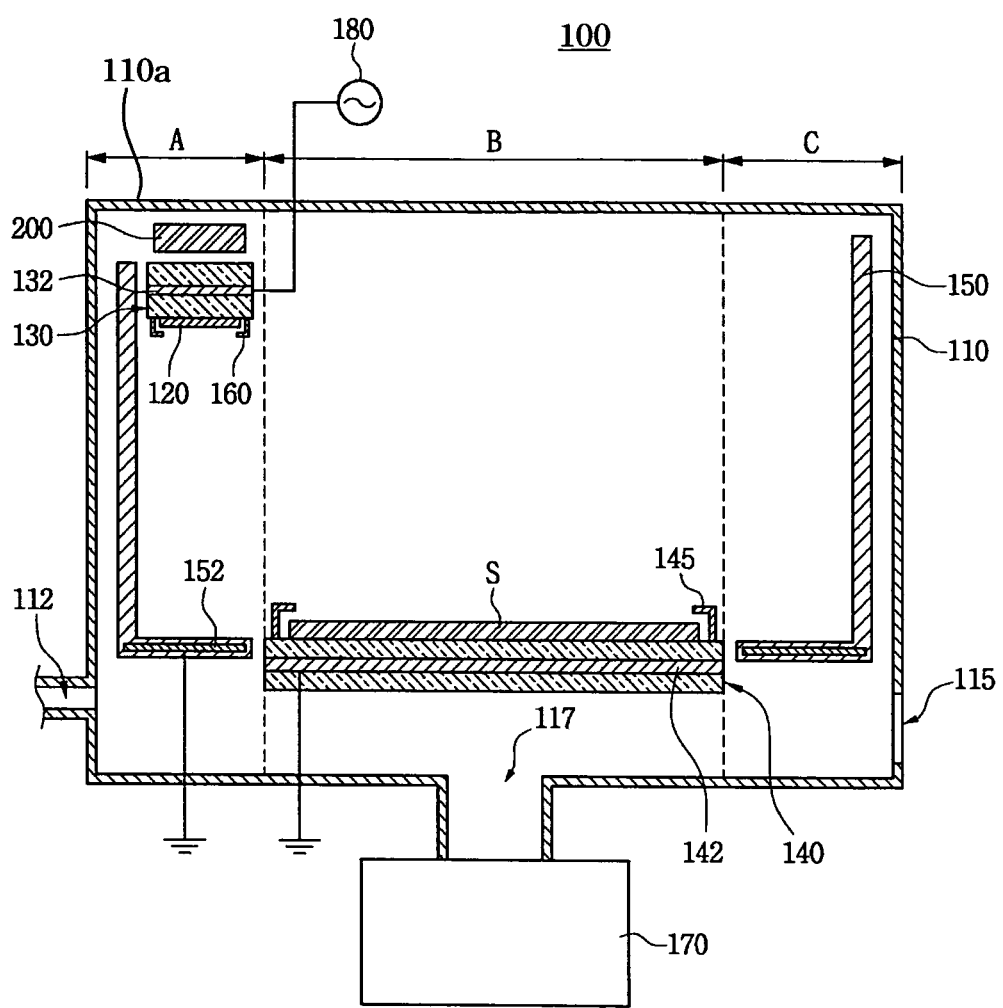

SPUTTERING APPARATUS

BACKGROUND

1. Field

An aspect of the described technology relates generally to a sputtering apparatus for depositing an extremely low concentration of a metal catalyst on amorphous silicon to crystallize the amorphous silicon. More particularly, an aspect of the described technology relates to a sputtering apparatus capable of sufficiently carrying out a pre-sputtering process in a short time and, thus, uniformly and stably depositing the extremely low concentration of the metal catalyst on the amorphous silicon without reducing efficiency of an overall deposition process.

2. Description of the Related Art

Flat panel display devices may replace cathode ray tube display devices due to their characteristics, e.g., a light weight, a thin thickness, and so on. Examples of the flat panel display devices may include liquid crystal displays (LCDs) and organic light emitting diode displays (OLEDs). For example, in comparison with the LCDs, the OLEDs exhibit excellent brightness and wide viewing angle characteristics and require no backlight, so that the OLEDs may be realized as ultra thin display devices.

The OLEDs may be classified into a passive matrix type and an active matrix type, according to a driving type. For example, the active matrix type-OLED may include a circuit using thin film transistors (TFTs).

The TFTs generally include a semiconductor layer having a source region, a drain region, and a channel region, and gate, source, and drain electrodes. The semiconductor layer may be formed of polycrystalline silicon (poly-Si) or amorphous silicon (a-Si). The poly-Si may exhibit higher electron mobility than the a-Si, so the poly-Si may be mainly applied at present.

The poly-Si semiconductor layer of the TFT may be formed by crystallizing the a-Si, e.g., by using a metal. A crystallization method using metal may crystallize the a-Si at a relatively low temperature in a short time by depositing a metal catalyst on a substrate. For example, a crystallization-inducing metal, e.g., nickel, may be deposited via sputtering on a substrate from a metal target made of the crystallization-inducing metal using plasma. In another example, the crystallization-inducing metal may be deposited via an atomic layer deposition (ALD) on the substrate using a chemical method based on a reaction gas containing the metal catalyst as the crystallization-inducing metal, so the a-Si may be crystallized using the metal catalyst as a seed.

SUMMARY

Embodiments are directed to a sputtering apparatus, which substantially overcomes one or more of the problems due to the limitations and disadvantages of the related art.

It is therefore a feature of an embodiment to provide a sputtering apparatus with a magnetic assembly only in a pre-sputtering region, thereby preventing magnetization of a metal catalyst during deposition thereof at an extremely low concentration, and performing the pre-sputtering process at a sufficiently short time.

At least one of the above and other features and advantages may be realized by providing a sputtering apparatus, including a process chamber having first and second regions, a metal target inside the process chamber, a target transfer unit inside the process chamber, the target transfer unit being configured to move the metal target between the first and second regions, a substrate holder in the second region of the process chamber, and a magnetic assembly in the first region of the process chamber, the magnetic assembly being interposed between the target transfer unit and a wall of the process chamber.

The sputtering apparatus may further include a first electrode inside the target transfer unit, and a second electrode inside the substrate holder, the second electrode receiving a power voltage having a polarity different from that of the first electrode. The first electrode may be connected with a power supply, and the second electrode is connected with a first reference voltage source. The sputtering apparatus may further include a third electrode in the first region and connected with a second reference voltage source, the third electrode being positioned opposite the magnetic assembly. The third electrode may be on an inner side of a first shield, the first shield surrounding the first and second regions. The sputtering apparatus may further include a first shield surrounding the first and second regions. The sputtering apparatus may further include a loading/unloading gate configured to load/unload a substrate into/out of the process chamber, and a holder transfer unit configured to move the substrate holder toward the loading/unloading gate. The sputtering apparatus may further include an inflow port introducing a reaction gas for producing plasma between the process chamber and the first shield. The reaction gas may include argon gas.

The sputtering apparatus may further include a clamping member on the substrate holder and configured to clamp the substrate. The metal target may include nickel. The sputtering apparatus may further include a second shield on the target transfer unit and configured to control a direction of a metal catalyst discharged from the metal target. The target transfer unit may reciprocate with the metal target within the second region during a deposition process. The magnetic assembly may be configured to operate only in the first region during a pre-sputtering process, and a metal catalyst is configured to be deposited on the substrate holder only in the second region during the deposition process. The sputtering apparatus may further include a rotating member configured to rotate the magnetic assembly. The sputtering apparatus may further include a vacuum pump connected to an exhaust port of the process chamber. The substrate holder and the magnetic assembly may overlap different horizontal portions of the process chamber, the horizontal portions extend in parallel to a surface supporting the process chamber. The substrate holder and the magnetic assembly may be spaced apart from each other along a horizontal direction, the horizontal direction being parallel to a wall of the process chamber connecting the first and second regions. The metal target may be configured to be opposite the substrate holder in the second region during a deposition process.

BRIEF DESCRIPTION OF THE DRAWINGS

The above and other features and advantages will become more apparent to those of ordinary skill in the art by describing in detail exemplary embodiments with reference to the attached drawing, in which:

FIG. 1 illustrates a schematic view of a sputtering apparatus according to an exemplary embodiment.

DETAILED DESCRIPTION

Korean Patent Application No. 10-2009-0123185, filed on Dec. 11, 2009, in the Korean Intellectual Property Office, and entitled: "Sputtering Apparatus," is incorporated by reference herein in its entirety.

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic view of a sputtering apparatus according to an exemplary embodiment.

Referring to FIG. 1, a sputtering apparatus 100 according to an exemplary embodiment may include a process chamber 110 having a first region A, i.e., where a pre-sputtering process is performed, and a second region B, i.e., where a deposition process is performed. The sputtering apparatus 100 may further include a metal target 120 located inside the process chamber 110, a target transfer unit 130 for moving the metal target 120 between the first and second regions A and B, a substrate holder 140 disposed in the second region B of the process chamber 110 so as to be opposite to the metal target 120 during deposition, a vacuum pump 170, and a magnetic assembly 200 in the first region A and interposed between the target transfer unit 130 and a wall 110a of the process chamber 110.

The process chamber 110 is to provide a space for performing the pre-sputtering and deposition processes. The process chamber 110 may further include a gas inflow port 112, i.e., an inlet supplying a reaction gas for producing plasma between the metal target 120 and the substrate holder 140, and an exhaust port 117 exhausting a residual reaction gas. The exhaust port 117 may be connected with the vacuum pump 170 for controlling a pressure in the process chamber 110, thereby easily exhausting the residual reaction gas without a separate exhaust pump. For example, the reaction gas may be argon gas, which can produce plasma with low power in order to prevent damage to a substrate S placed on the substrate holder 140.

The process chamber 110 may further include a loading/unloading gate 115 and a first shield 150. The loading/unloading gate 115 may be formed through a wall of the process chamber 110, and may facilitate loading and unloading of the substrate S into/out of the process chamber 110. The first shield 150 may be positioned inside the process chamber 110, and may surround at least some portions of the first and second regions A and B. For example, the first shield 150 may extend between the metal target 120 and the substrate holder 140 in the first region A, e.g., in an L-shape, in order to prevent production of unnecessary plasma and to minimize damage to a-Si on the substrate S, i.e., loaded or unloaded, by plasma remaining in the process chamber 110. When the substrate S is loaded/unloaded through the loading/unloading gate 115, the substrate S may be passed in/out of the plasma production region through the first shield 150. In this case, the process chamber 110 may further include a holder transfer unit (not shown) for moving the substrate holder 140 toward the loading/unloading gate 115 through the second region B and the first shield 150. It is noted that the process chamber 110 may further include a third region C including a portion of the first shield 150, e.g., the first and third regions A and C may operate identically.

The sputtering apparatus 100 according to an exemplary embodiment may be configured such that the reaction gas introduced through the gas inflow port 112 of the processor chamber 110 passes through the first shield 150 to be directly supplied to the first and second regions A and B. However, as weak plasma may be produced to facilitate deposition of a low concentration of a metal catalyst on the substrate S, the gas inflow port 112 may supply the reaction gas between walls of the process chamber 110 and the first shield 150, i.e. to a peripheral part of the process chamber 110 which is not surrounded by the first shield 150.

The metal target 120 in the process chamber 110 discharges a crystallization-inducing metal, i.e., a metal catalyst. For example, in a crystallization method, the metal target 120 may discharge metal, e.g., nickel, toward the substrate S placed on the substrate holder 140. The metal target 120 may include a second shield 160 for controlling a traveling direction of the metal catalyst, e.g., the second shield 160 may surround the metal target 120.

The target transfer unit 130 may be configured to move the metal target 120 between the first and second regions A and B in the process chamber 110, e.g., the target transfer unit 130 and the metal target 120 may be connected to each other and move together between the first and second regions A and B. That is, the target transfer unit 130 may position the metal target 120 in the first region A before the deposition process, i.e., to perform a pre-sputtering process in the first region A. For example, the target transfer unit 130 may position the metal target 120 in an upper portion of the process chamber 110, e.g., adjacent to an upper edge of the first shield 150, so the first shield 150 may be between the metal target 120 and a sidewall of the process chamber 110. Further, the target transfer unit 130 may move the metal target 120 from the first region A to the second region B after the pre-sputtering process is complete, so the metal target 120 may be located in the second region B to perform the deposition process. For example, the target transfer unit 130 may position the metal target 120 opposite the substrate S, e.g., the metal target 120 and the substrate S may overlap each other and extend in parallel to each other, thereby allowing the metal catalyst to be deposited on the substrate S. It is noted that while the deposition process is performed, the target transfer unit 130 causes the metal target 120 to be reciprocated within the second region B, thereby allowing an extremely low concentration of the metal catalyst to be more uniformly deposited on the substrate S.

The substrate holder 140 may support the substrate S loaded into the process chamber 110, e.g., the substrate holder 140 may be stationary. The substrate holder 140 may include a clamping member 145 clamping the substrate S. For example, the clamping member 145 may surround an edge of the substrate S, thereby preventing the substrate S from being damaged by movement of the substrate holder 140.

In the sputtering apparatus 100 according to an exemplary embodiment, the process chamber 110 may further include a first electrode 132 located inside the target transfer unit 130 moving the metal target 120 and a second electrode 142 located inside the substrate holder 140 and connected with a power voltage having a polarity different from that of the first electrode 132. Therefore, plasma may be easily produced between the metal target 120 and the substrate holder 140. Since during the deposition process both the metal target 120 and the substrate holder 140 are in the second region B, plasma is produced only in the second region B during the deposition process, i.e., no plasma is produced in the first region A during the deposition process.

Since the plasma produced in the process chamber 110 is dependent upon a voltage difference between the first and second electrodes 132 and 142, the first electrode 132 may be connected to a power supply 180 supplying a constant DC voltage, whereas the second electrode 142 may be connected to a first reference voltage source. Therefore, it may be possible to easily control production of the plasma during the deposition process.

The process chamber 110 may further include a third electrode 152, which supplies a reference voltage to an inner side of the first shield 150 in the first region A. In detail, the third electrode 152 may be positioned in a portion of the first shield 150 located opposite the metal target 120 within the first region A, e.g., the metal target 120 and the third electrode 152 may be adjacent to opposite walls of the process chamber 110. The third electrode 152 may be connected to a second reference voltage source, which may be controlled independently of the first reference voltage source supplying the reference voltage to the second electrode 142. Therefore, when the metal target 120 is positioned in the first region A during the pre-sputtering process, the metal target 120 and the third electrode 152 may face each other to produce plasma therebetween during the pre-sputtering process. As the second and third electrodes 142 and 152 are controlled independently of each other, the pre-sputtering process may be performed more efficiently and independently of the deposition process.

In other words, the sputtering apparatus 100 according to an exemplary embodiment may provide plasma only in the first region A during the pre-sputtering process, i.e., so no plasma is produced in the second region B during the pre-sputtering process. Further, the sputtering apparatus 100 may provide plasma only in the second region B during the deposition process, i.e., so no plasma is produced in the first region A during the deposition process. That is, plasma may be produced only in one of the first and second regions A and B of the process chamber 110, in accordance with the location of the metal target 120.

The magnetic assembly 200 may be positioned in the first region A of the process chamber 110, e.g., the magnetic assembly 200 may be stationary, and may focus the plasma produced in the first region A on the lower portion of the metal target 120, i.e., when the metal target 120 is in the first region A of the processor chamber 110. The sputtering apparatus 100 may further include a rotating member (not shown) for rotating the magnetic assembly 200, such that the foreign materials attached to the surface of the metal target 120 may be more easily removed. As the magnetic assembly 200 is only in the first region A, plasma focus may be performed only in the first region A, so no magnetization can occur in the second region B during metal deposition.

In other words, in the sputtering apparatus 100 according to an exemplary embodiment, the process chamber 110 may be divided into a region where the pre-sputtering process is performed and a region where the deposition process is performed. The magnetic assembly is disposed only in the region for the pre-sputtering process, so the pre-sputtering process may be performed using the magnetic assembly, while the deposition process may be performed without using the magnetic assembly. As a result, the sputtering apparatus may sufficiently perform the pre-sputtering process in a short time in one region of the process chamber, may prevent the magnetization of the metal catalyst during the deposition process in another region of the process chamber, and may deposit an extremely low concentration of the metal catalyst in a uniform, stable manner.

Thus, a sputtering apparatus according to an exemplary embodiment may divide a process chamber into a region where a pre-sputtering process is performed and a region where a deposition process is performed. As the magnetic assembly is only in the pre-sputtering process region, the pre-sputtering process may be performed in a short time and an extremely low concentration of a metal catalyst may be deposited in a uniform, stable manner.

In contrast, when a sputtering apparatus includes a magnetic assembly in a deposition region of a process chamber, i.e., to concentrate the plasma on the metal target and uniformly deposit a thick metal layer on a substrate in a short time, the magnetic assembly may magnetize the metal target. As such, the metal catalyst may remain in a resultant poly-Si layer, thereby deteriorating characteristics of the resultant poly-Si layer, e.g., a resultant TFT may be unstably driven when the metal catalyst remains in the poly-Si layer. Further, when a sputtering apparatus uses a pre-sputtering process to remove foreign materials, e.g., $NiO_2$, from a surface of the metal target prior to the deposition process so as to more uniformly and stably deposit the extremely-low-concentration metal catalyst, it may be difficult to perform the pre-sputtering process without concentration of the plasma via the magnetic assembly. As such, deposition of the metal catalyst may not be stable, and the time required for the pre-sputtering process may increase to reduce efficiency of the overall deposition process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A sputtering apparatus, comprising:
a process chamber having first and second regions;
a metal target inside the process chamber;
a target transfer unit inside the process chamber, the target transfer unit being configured to move the metal target between the first and second regions;
a substrate holder in the second region of the process chamber; and
a magnetic assembly in the first region of the process chamber, the magnetic assembly being interposed between the target transfer unit and a wall of the process chamber,
wherein the magnetic assembly is stationary and is configured to focus plasma only in the first region during a pre-sputtering process, and a metal catalyst is configured to be deposited on the substrate holder only in the second region during the deposition process.

2. The sputtering apparatus as claimed in claim 1, further comprising:
a first electrode inside the target transfer unit, the first electrode being configured to be moved by the target transfer unit from the first region to the second region; and
a second electrode inside the substrate holder, the second electrode receiving a power voltage having a polarity different from that of the first electrode.

3. The sputtering apparatus as claimed in claim 2, wherein the first electrode is connected with a power supply, and the second electrode is connected with a first reference voltage source.

4. The sputtering apparatus as claimed in claim 2, further comprising a third electrode in the first region and connected with a second reference voltage source, the third electrode being positioned opposite the magnetic assembly, and the first electrode being configured to overlap and interact with only one of the second and third electrodes at a time.

5. The sputtering apparatus as claimed in claim 4, wherein the third electrode is on an inner side of a first shield, the first shield surrounding the first and second regions.

6. The sputtering apparatus as claimed in claim 1, further comprising a first shield surrounding the first and second regions.

7. The sputtering apparatus as claimed in claim 6, further comprising:
   a loading/unloading gate configured to load/unload a substrate into/out of the process chamber; and
   a holder transfer unit configured to move the substrate holder toward the loading/unloading gate.

8. The sputtering apparatus as claimed in claim 6, further comprising an inflow port introducing a reaction gas for producing plasma between the process chamber and the first shield.

9. The sputtering apparatus as claimed in claim 8, wherein the reaction gas includes argon gas.

10. The sputtering apparatus as claimed in claim 1, further comprising a clamping member on the substrate holder and configured to clamp the substrate.

11. The sputtering apparatus as claimed in claim 1, wherein the metal target includes nickel.

12. The sputtering apparatus as claimed in claim 1, further comprising a second shield on the target transfer unit and configured to control a direction of a metal catalyst discharged from the metal target.

13. The sputtering apparatus as claimed in claim 1, wherein the target transfer unit reciprocates with the metal target within the second region during a deposition process.

14. The sputtering apparatus as claimed in claim 1, further comprising a rotating member configured to rotate the magnetic assembly.

15. The sputtering apparatus as claimed in claim 1, further comprising a vacuum pump connected to an exhaust port of the process chamber.

16. The sputtering apparatus as claimed in claim 1, wherein the substrate holder and the magnetic assembly overlap different horizontal portions of the process chamber, the horizontal portions extending in parallel to a surface supporting the process chamber.

17. The sputtering apparatus as claimed in claim 1, wherein the substrate holder and the magnetic assembly are spaced apart from each other along a horizontal direction, the horizontal direction being parallel to a wall of the process chamber connecting the first and second regions.

18. The sputtering apparatus as claimed in claim 1, wherein the target transfer unit is configured to transfer the metal target between the magnetic assembly and a substrate on the substrate holder.

19. A sputtering apparatus, comprising:
   a process chamber having first and second regions;
   a metal target inside the process chamber;
   a target transfer unit inside the process chamber, the target transfer unit being configured to move the metal target between the first and second regions;
   a substrate holder in the second region of the process chamber; and
   a magnetic assembly in the first region of the process chamber, the magnetic assembly being interposed between the target transfer unit and a wall of the process chamber, wherein each of the magnetic assembly and substrate is stationary.

20. A sputtering apparatus, comprising:
   a process chamber having first and second regions;
   a metal target inside the process chamber;
   a target transfer unit inside the process chamber, the target transfer unit being configured to move the metal target between the first and second regions;
   a substrate holder in the second region of the process chamber; and
   a magnetic assembly in the first region of the process chamber, the magnetic assembly being interposed between the target transfer unit and a wall of the process chamber, wherein the magnetic assembly and substrate do not overlap.

21. The sputtering apparatus as claimed in claim 1, wherein the target transfer unit is in a region between a first line and a second line, the first line being defined by the magnetic assembly and an extension line extending therefrom, and the second line being defined by the substrate holder and an extension line extending therefrom.

22. The sputtering apparatus as claimed in claim 1, wherein the first and second regions of the process chamber have no wall therebetween.

* * * * *